United States Patent
Toyoguchi

(10) Patent No.: US 10,868,069 B2
(45) Date of Patent: Dec. 15, 2020

(54) SOLID STATE IMAGING DEVICE, IMAGING SYSTEM, AND MOBILE APPARATUS

(71) Applicant: CANON KABUSHIKI KAISHA, Tokyo (JP)

(72) Inventor: Ginjiro Toyoguchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 41 days.

(21) Appl. No.: 15/990,361

(22) Filed: May 25, 2018

(65) Prior Publication Data

US 2018/0350864 A1 Dec. 6, 2018

(30) Foreign Application Priority Data

Jun. 2, 2017 (JP) .................. 2017-110068

(51) Int. Cl.
*H01L 27/146* (2006.01)
*G06T 7/55* (2017.01)
*H04N 5/378* (2011.01)

(52) U.S. Cl.
CPC .......... *H01L 27/14625* (2013.01); *G06T 7/55* (2017.01); *H01L 27/1461* (2013.01);
(Continued)

(58) Field of Classification Search
CPC .......... H01L 27/14625; H01L 27/1461; H01L 27/14612; H01L 27/14627; H01L 27/1463;
(Continued)

(56) References Cited

U.S. PATENT DOCUMENTS 8,514,309 B2 * 8/2013 Kato ................. H01L 27/14625
348/294
8,921,900 B2 12/2014 Iida
(Continued)

FOREIGN PATENT DOCUMENTS

| JP | 2007-227643 A | 9/2007 |
| JP | 2010-245100 A | 10/2010 |
| JP | 2014-165286 A | 9/2014 |

OTHER PUBLICATIONS

U.S. Appl. No. 15/877,868 filed Jan. 23, 2018.
U.S. Appl. No. 16/013,166 filed Jun. 20, 2018.

*Primary Examiner* — James M Pontius
(74) *Attorney, Agent, or Firm* — Venable LLP

(57) ABSTRACT

Provided is a solid state imaging device including a pixel in which the pixel has a photoelectric conversion unit provided in a semiconductor substrate and a light guide having a bottom that emits an incident light to the photoelectric conversion unit. The photoelectric conversion unit includes a first semiconductor region of a first conductivity type provided at a first depth of the semiconductor substrate, and second and third semiconductor regions of a second conductivity type provided at a second depth located under the first depth of the semiconductor substrate and spaced apart from each other by a first region. Each of the second semiconductor region, the third semiconductor region, and the first region overlaps with a part of the first semiconductor region in a planar view. At least a part of the bottom and at least a part of the first region overlap with each other in the planar view.

19 Claims, 10 Drawing Sheets

(52) U.S. Cl.
CPC .. *H01L 27/14612* (2013.01); *H01L 27/14627* (2013.01); *G06T 2207/30261* (2013.01); *H01L 27/1463* (2013.01); *H04N 5/378* (2013.01)

(58) Field of Classification Search
CPC .. G06T 7/55; G06T 2207/30261; H04N 5/378
See application file for complete search history.

(56) References Cited

U.S. PATENT DOCUMENTS

| | | |
|---|---|---|
| 9,124,833 B2 | 9/2015 | Toyoguchi |
| 9,548,328 B2 | 1/2017 | Hasegawa |
| 2011/0102651 A1* | 5/2011 | Tay ................... H01L 27/14625 348/280 |
| 2013/0002918 A1* | 1/2013 | Kobayashi .............. H01L 31/18 348/311 |
| 2018/0108800 A1* | 4/2018 | Morimoto ......... H01L 31/02005 |

* cited by examiner

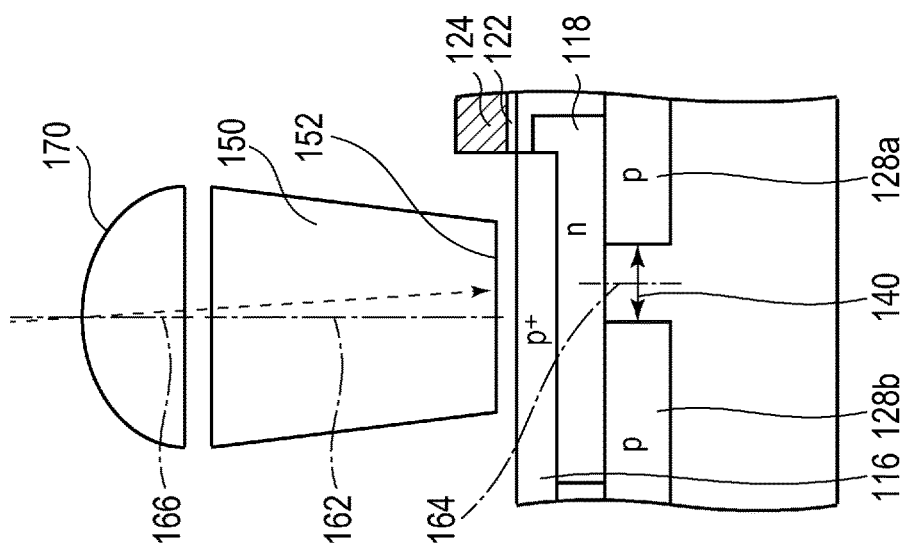
FIG. 8C    FIG. 8B
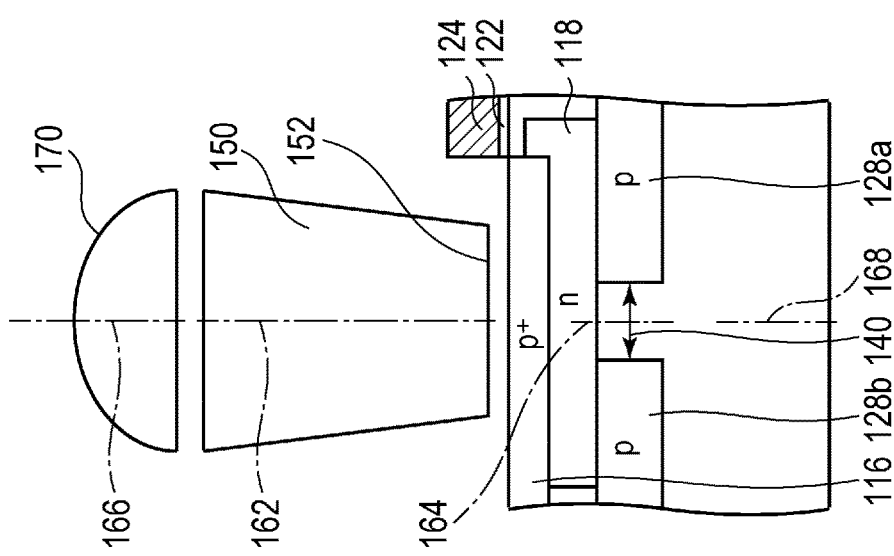
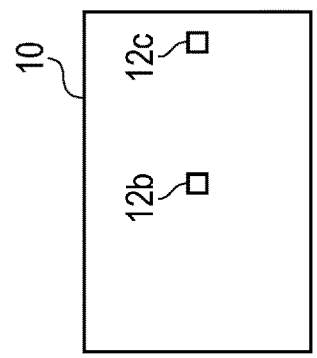
FIG. 8A

SOLID STATE IMAGING DEVICE, IMAGING SYSTEM, AND MOBILE APPARATUS

BACKGROUND OF THE INVENTION

Field of the Invention

The present invention relates to a solid state imaging device, an imaging system, and a mobile apparatus.

Description of the Related Art

In solid state imaging devices represented by a CMOS image sensor, the sensitivity and saturation charge amount of a photoelectric conversion unit are one of the important characteristics of a solid state imaging device.

An example of the structure of a substrate in which a photoelectric conversion unit is arranged may be the p-type well structure. The p-type well structure is structure in which a photoelectric conversion unit is arranged inside the p-type well provided on the surface of a semiconductor substrate.

Japanese Patent Application Laid-Open No. 2014-165286 discloses a solid state imaging device having a photoelectric conversion unit of the p-type well structure. According to Japanese Patent Application Laid-Open No. 2014-165286, the p-n junction capacitance is increased by arranging a p-type semiconductor region under an n-type semiconductor region forming a charge accumulation region. This may increase the saturation charge amount of the photoelectric conversion unit.

In recent years, however, there is a demand for a further increase in the sensitivity of solid state imaging devices, and the sensitivity may be insufficient in the solid state imaging device disclosed in Japanese Patent Application Laid-Open No. 2014-165286.

SUMMARY OF THE INVENTION

According to an aspect of the present invention, provided is a solid state imaging device including a pixel in which the pixel has a photoelectric conversion unit and a light guide, the photoelectric conversion unit is provided in a semiconductor substrate, and the light guide has a bottom that emits an incident light to the photoelectric conversion unit. The photoelectric conversion unit includes a first semiconductor region of a first conductivity type provided at a first depth of the semiconductor substrate, and a second semiconductor region of a second conductivity type and a third semiconductor region of the second conductivity type provided at a second depth located under the first depth of the semiconductor substrate and spaced apart from each other by a first region. Each of the second semiconductor region, the third semiconductor region, and the first region overlaps with a part of the first semiconductor region in a planar view, and at least a part of the bottom and at least a part of the first region overlap with each other in the planar view.

Further features of the present invention will become apparent from the following description of exemplary embodiments with reference to the attached drawings.

BRIEF DESCRIPTION OF THE DRAWINGS

FIG. 8A, FIG. 8B, and FIG. 8C are diagrams illustrating the general structure of a pixel of a solid state imaging device according to a fourth embodiment of the present invention.

DESCRIPTION OF THE EMBODIMENTS

Preferred embodiments of the present invention will now be described in detail in accordance with the accompanying drawings. Elements corresponding to each other over a plurality of drawings are labeled with a common reference, and the description thereof may be omitted or simplified.

First Embodiment

A solid state imaging device according to a first embodiment of the present invention will be described by using FIG. 1 to FIG. 4, FIG. 5A, FIG. 5B, and FIG. 5C.

Figure 1:
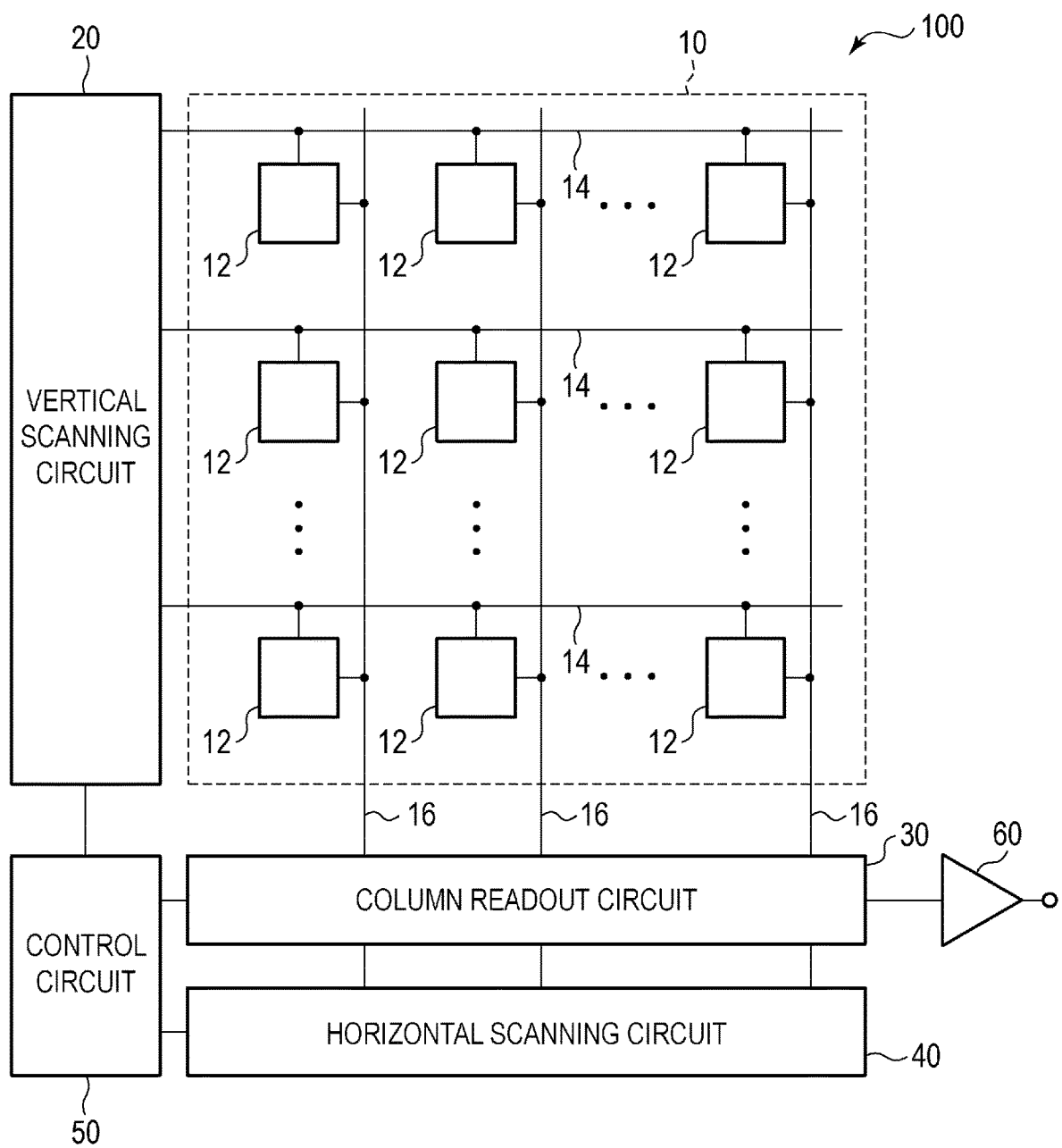
FIG. 1 is a block diagram illustrating the general structure of a solid state imaging device according to a first embodiment of the present invention.
Figure 2:
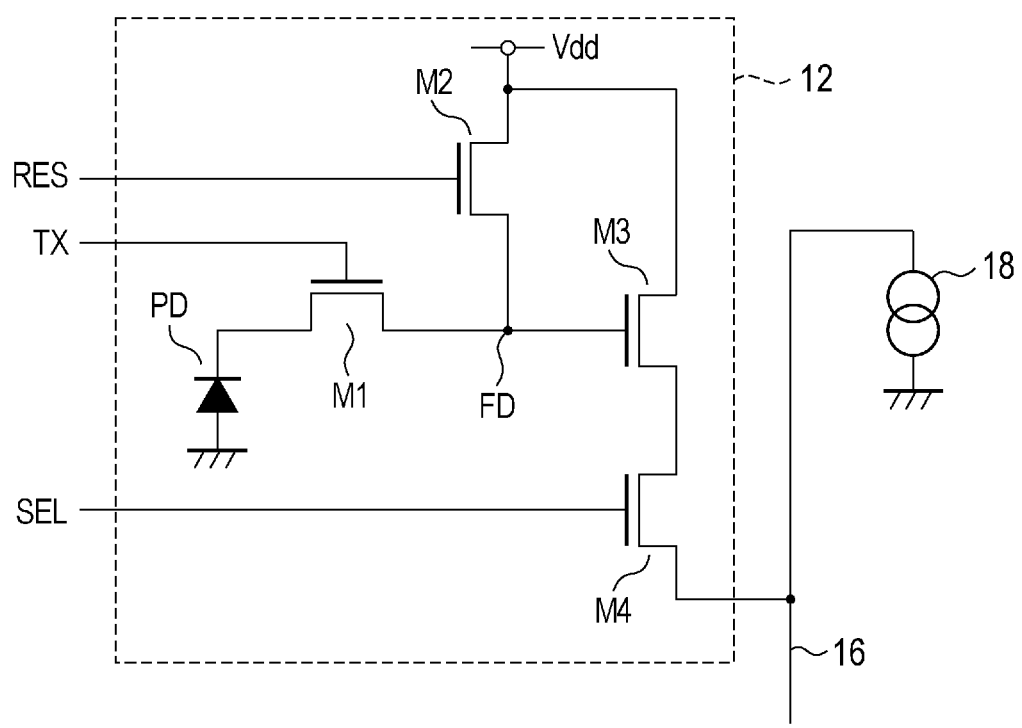
FIG. 2 is an equivalent circuit diagram of a pixel of the solid state imaging device according to the first embodiment of the present invention.
Figure 3:
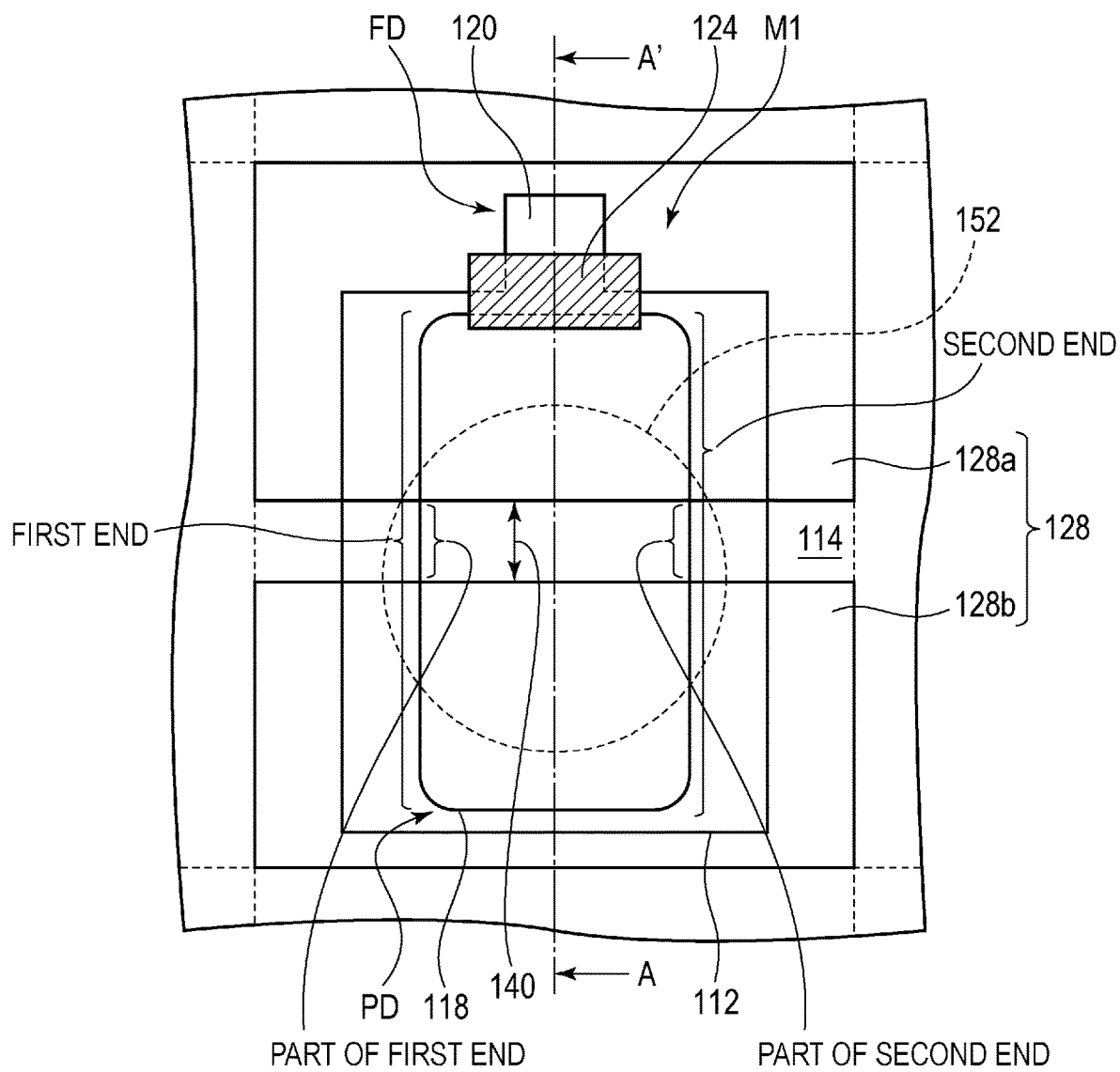
FIG. 3 is a diagram illustrating a plan layout of the pixel of the solid state imaging device according to the first embodiment of the present invention.
Figure 4:
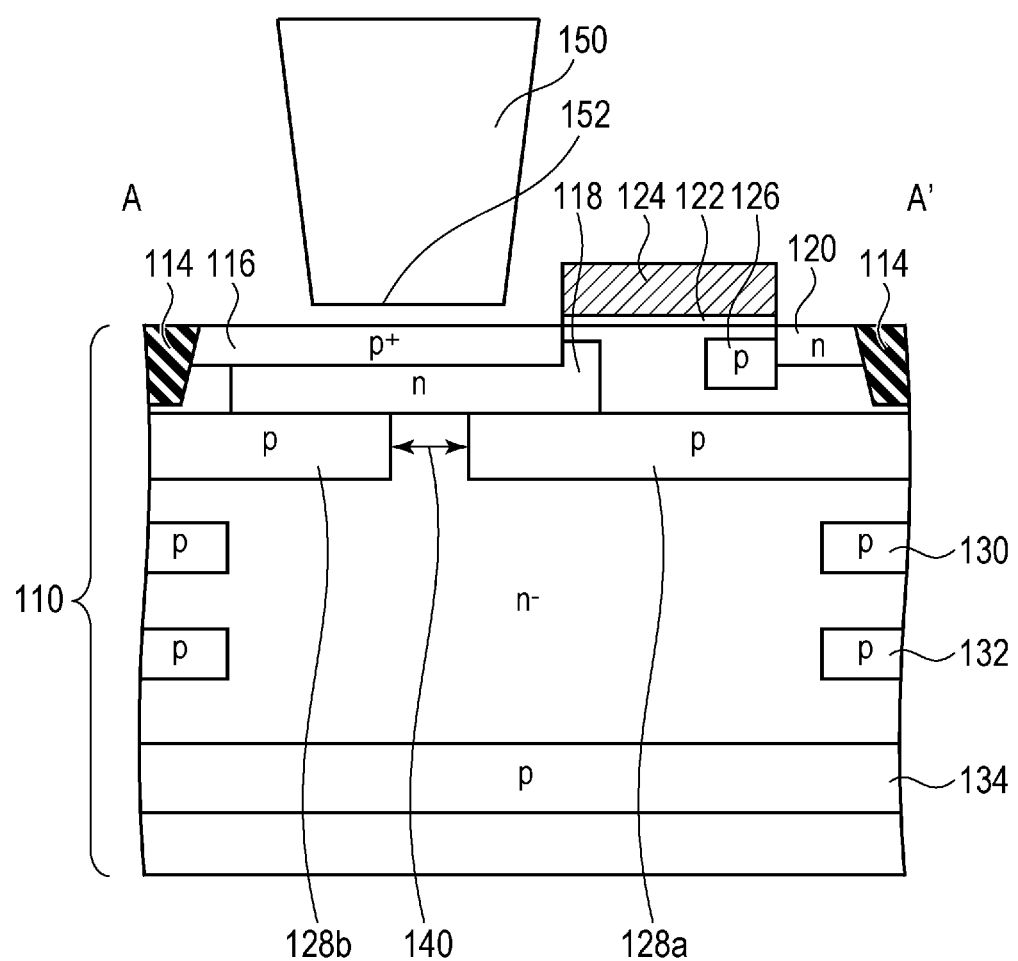
FIG. 4 is a schematic sectional view of the pixel of the solid state imaging device according to the first embodiment of the present invention.
Figure 5A:
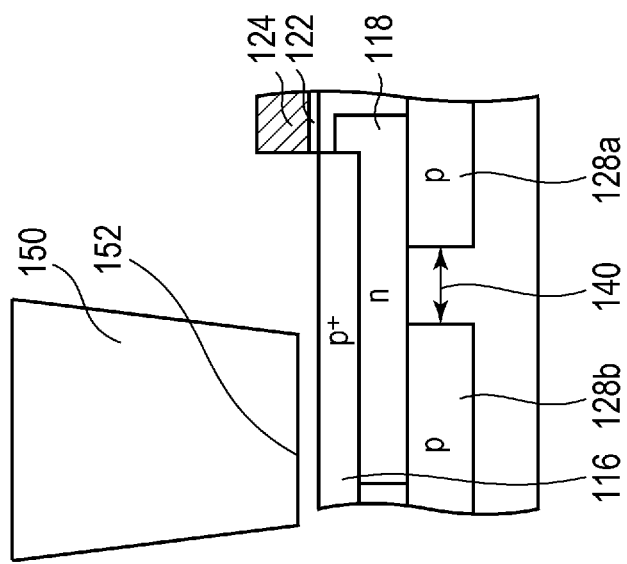
FIG. 5A, FIG. 5B, and FIG. 5C are schematic sectional views according to another configuration example of the pixel of the solid state imaging device according to the first embodiment of the present invention.
Figure 5B:
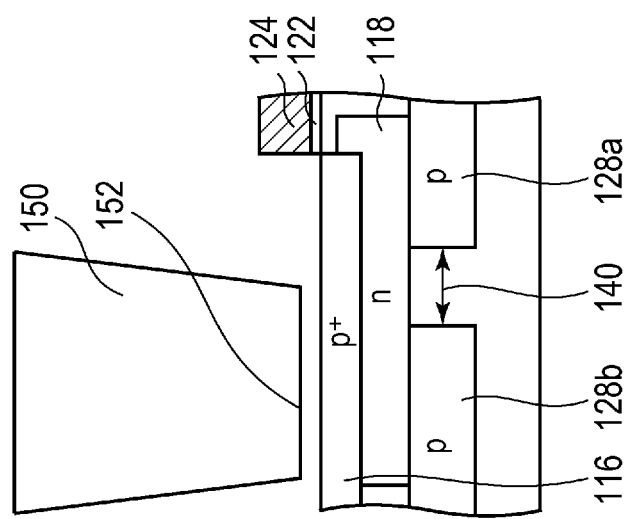
Figure 5C:
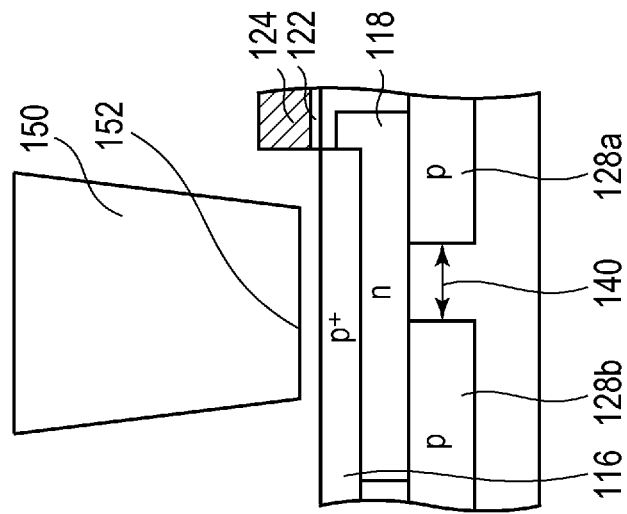

FIG. 1 is a block diagram illustrating the general structure of the solid state imaging device according to the present embodiment. FIG. 2 is an equivalent circuit diagram of a pixel of the solid state imaging device according to the present embodiment. FIG. 3 is a diagram illustrating a plan layout of the pixel of the solid state imaging device according to the present embodiment. FIG. 4 is a schematic sectional view of the pixel of the solid state imaging device according to the present embodiment. FIG. 5A, FIG. 5B, and FIG. 5C are schematic sectional views according to another configuration example of the pixel of the solid state imaging device according to the present embodiment.

As illustrated in FIG. 1, a solid state imaging device 100 according to the present embodiment has a pixel region 10, a vertical scanning circuit 20, a column readout circuit 30, a horizontal scanning circuit 40, a control circuit 50, and an output circuit 60.

In the pixel region 10, a plurality of pixels 12 are arranged in a matrix over a plurality of rows and a plurality of columns. A control signal line 14 is arranged extending in the row direction (the horizontal direction in FIG. 1) on each row of the pixel array of the pixel region 10. The control signal line 14 is connected to the pixels 12 aligned in the row direction, respectively, to form a signal line common to these pixels 12. Further, on each column of the pixel array of the pixel region 10, a vertical output line 16 is arranged extending in a column direction (the vertical direction in FIG. 1). The vertical output line 16 is connected to the pixels 12 aligned in the column direction, respectively, to form a signal line common to these pixels 12.

The control signal line 14 on each row is connected to the vertical scanning circuit 20. The vertical scanning circuit 20 is a circuit unit that supplies, to the pixel 12 via the control signal line 14, control signals used for driving readout circuits inside the pixels 12 when pixel signals are read out from the pixel 12. One end of the vertical output line 16 on each column is connected to the column readout circuit 30. A pixel signal read out from the pixel 12 is input to the column readout circuit 30 via the vertical output line 16. The column readout circuit 30 is a circuit unit that performs predetermined signal processing, for example, signal processing such as an amplifying process, an analog-to-digital (AD) conversion process on a pixel signal read out from the pixel 12. The column readout circuit 30 may include differential amplifier circuits, sample-hold circuits, AD conversion circuits, or the like.

The horizontal scanning circuit 40 is a circuit unit that supplies, to the column readout circuit 30, control signals used for transferring pixel signals processed in the column readout circuit 30 to the output circuit 60 sequentially on a column basis. The control circuit 50 is a circuit unit that supplies control signals that control the operation or the timing of the vertical scanning circuit 20, the column readout circuit 30, and the horizontal scanning circuit 40. The output circuit 60 is a circuit unit that is formed of a buffer amplifier, a differential amplifier, or the like and outputs pixel signals read out from the column readout circuit 30 to a signal processing unit outside the solid state imaging device 100.

As illustrated in FIG. 2, each of the pixels 12 includes a photoelectric conversion unit PD, a transfer transistor M1, a reset transistor M2, an amplification transistor M3, and a select transistor M4. The photoelectric conversion unit PD is a photodiode, for example, the anode is connected to a ground voltage line, and the cathode is connected to the source of the transfer transistor M1. The drain of the transfer transistor M1 is connected to the source of the reset transistor M2 and the gate of the amplification transistor M3. The connection node of the drain of the transfer transistor M1, the source of the reset transistor M2, and the gate of the amplification transistor M3 is a so-called floating diffusion (FD) and forms a charge-to-voltage conversion unit comprising a capacitance component included in this node. The drain of the reset transistor M2 and the drain of the amplification transistor M3 are connected to a power source voltage line (Vdd). The source of the amplification transistor M3 is connected to the drain of the select transistor M4. The source of the select transistor M4 is connected to the vertical output line 16. A current source 18 is connected to the other end of the vertical output line 16.

In the case of the circuit configuration illustrated in FIG. 2, the control signal line 14 includes a transfer signal line TX, a reset signal line RES, and a select signal line SEL. The transfer signal line TX is connected to the gate of the transfer transistor M1. The reset signal line RES is connected to the gate of the reset transistor M2. The select signal line SEL is connected to the gate of the select transistor M4.

The photoelectric conversion unit PD converts (photo-electrically converts) an incident light into an amount of charges in accordance with the light amount and accumulates generated charges. When turned on, the transfer transistor M1 transfers charges of the photoelectric conversion unit PD to the floating diffusion FD. The floating diffusion FD is set to a voltage in accordance with the amount of charges transferred from the photoelectric conversion unit PD according to charge-to-voltage conversion due to the capacitance of the floating diffusion FD. The amplification transistor M3 is configured such that the power source voltage is supplied to the drain and a bias current is supplied to the source from the current source 18 via the select transistor M4, which forms an amplification unit whose input node is the gate (source follower circuit). Thereby, the amplification transistor M3 outputs a signal based on the voltage of the floating diffusion FD to the vertical output line 16 via the select transistor M4. When turned on, the reset transistor M2 resets the floating diffusion FD to a voltage in accordance with the power source voltage Vdd.

FIG. 3 is a diagram illustrating a plan layout of the pixel 12 of the solid state imaging device 100 according to the present embodiment. FIG. 4 is a schematic sectional view taken along a line A-A' of FIG. 3. FIG. 3 and FIG. 4 illustrate only the photoelectric conversion unit PD and the transfer transistor M1 out of the components of the pixel 12. Note that, while the plan layout of only one of the pixels 12 is illustrated in FIG. 3, the plan layouts of FIG. 3 are periodically arranged at a predetermined unit pixel pitch in the lateral direction and the perpendicular direction in the actual implementation. FIG. 3 illustrates an example of boundaries between neighboring pixels 12 by dashed lines.

An element isolation insulating region 114 that defines an active region 112 is provided on the surface of an n-type semiconductor substrate 110 of a low impurity concentration. A photodiode forming the photoelectric conversion unit PD, the transfer transistor M1, and the floating diffusion FD as a charge holding portion that holds charges transferred from the photoelectric conversion unit PD are arranged in the active region 112.

The photoelectric conversion unit PD is an embedded-type photodiode including a p-type semiconductor region 116 provided on the surface of the active region 112 of the semiconductor substrate 110 and an n-type semiconductor region 118 (first semiconductor region) provided in contact with the under the p-type semiconductor region 116. The n-type semiconductor region 118 is provided at a first depth in the semiconductor substrate 110. The n-type semiconductor region 118 is a charge accumulation layer for accumulating signal charges (electrons) generated in the photoelectric conversion unit PD. Note that a configuration without the p-type semiconductor region 116 being provided may be possible. Further, in the present specification, one of the p-type and the n-type may be referred to as a first conductivity type, and the other may be referred to as a second conductivity type.

The floating diffusion FD is formed of an n-type semiconductor region 120 provided spaced apart from the n-type semiconductor region 118 on the surface of the active region 112 of the semiconductor substrate 110.

The transfer transistor M1 includes a gate electrode 124 provided via a gate insulating film 122 on the semiconductor substrate 110 between the n-type semiconductor region 118 and the n-type semiconductor region 120. Inside the semiconductor substrate 110 between the n-type semiconductor region 118 and the n-type semiconductor region 120, a p-type semiconductor region 126 for electrically isolating them is provided.

A p-type semiconductor region 128 as a depletion suppression layer for suppressing expansion of a depletion layer downward from the n-type semiconductor region 118 is provided at a second depth located under the n-type semiconductor region 118. The p-type semiconductor region 128 is formed of a stripe pattern extending in the row direction (the horizontal direction in FIG. 3) in a planar view.

FIG. 3 illustrates two adjacent stripe-patterned p-type semiconductor regions 128a (second semiconductor region) and 128b (third semiconductor region) and a gap 140 (first region) therebetween. The gap 140 between the p-type semiconductor region 128a and the p-type semiconductor region 128b is arranged so as to traverse the n-type semiconductor region 118 in a planar view. Further, it can be said that the n-type semiconductor region 118 has the first region that does not overlap with the p-type semiconductor region 128 in a position corresponding to the gap 140 in the planar view. Alternatively, when a region where the n-type semiconductor region 118 and the p-type semiconductor region 128a overlap with each other is defined as a second region and a region where the n-type semiconductor region 118 and the p-type semiconductor region 128b overlap with each other is defined as a third region, it can be said that the second region and the third region are spaced apart from each other. Furthermore, the n-type semiconductor region 118 has a first end and a second end opposed to the first end in the planar view. It can be said that the second region and the third region are spaced apart from each other over a part of the first end and a part of the second end. Note that, in the present specification, the planar view is a two-dimensional plan view obtained by projecting respective components of the solid state imaging device on a plane parallel to the surface of the semiconductor substrate 110 and corresponds to a plan layout view of FIG. 3, for example.

In a deeper portion of the semiconductor substrate 110, p-type semiconductor regions 130, 132, and 134 are provided. The p-type semiconductor region 130 serves to isolate the pixels 12 inside the semiconductor substrate 110. The p-type semiconductor region 132 serves to isolate the pixels 12 inside the semiconductor substrate 110 located deeper than the p-type semiconductor region 130. The p-type semiconductor region 134 is for defining the depth at which signal charges generated in the semiconductor substrate 110 are effectively collected. Note that, in the present specification, the surface of the semiconductor substrate 110 electrically isolated by the p-type semiconductor region 126 may be referred to as a semiconductor region.

With the p-type semiconductor region 128 being provided under the n-type semiconductor region 118, a p-n junction capacitance is formed between the n-type semiconductor region 118 and the p-type semiconductor region 128. As is clear from the relational expression represented as Q=CV, when a predetermined reverse bias voltage is applied to a p-n junction of the photoelectric conversion unit PD, a larger p-n junction capacitance C results in a larger accumulation charge amount Q. While signal charges accumulated in the n-type semiconductor region 118 are transferred to a signal output portion, once the potential of the n-type semiconductor region 118 reaches a certain potential determined by the power source voltage or the like, signal charges of the n-type semiconductor region 118 are no longer transferred. That is, since the amount of change in the voltage V due to transfer of signal charges is fixed, the saturation charge amount increases proportionally to the p-n junction capacitance of the photoelectric conversion unit PD. Therefore, with the p-type semiconductor region 128 being provided, the saturation charge amount of the n-type semiconductor region 118 as the charge accumulation layer can be increased.

Further, the gap 140 between the p-type semiconductor region 128a and the p-type semiconductor region 128b serves as a traveling path of signal charges when signal charges generated inside the semiconductor substrate 110 between the n-type semiconductor region 118 and the p-type semiconductor region 134 are collected in the n-type semiconductor region 118. Therefore, by suitably setting the size and the shape of the gap 140 and the impurity concentration of the p-type semiconductor region 128, signal charges generated inside the semiconductor substrate 110 between the n-type semiconductor region 118 and the p-type semiconductor region 134 can be quickly collected in the n-type semiconductor region 118. That is, substantially the same sensitivity as the sensitivity obtained in the structure without the p-type semiconductor region 128 being provided can be obtained.

Note that it is desirable to arrange the gap 140 close to the center of the n-type semiconductor region 118 in the planar view. The n-type semiconductor region 118 has a potential distribution in which the potential is higher at the center and the potential is lower at the ends. Thus, in order to effectively collecting signal charges generated at a deeper location than the p-type semiconductor region 128 into the n-type semiconductor region 118 by using drift, it is effective to provide the gap 140 close to the center of the n-type semiconductor region 118 having a higher potential. Further, arranging the gap 140 close to the center of the n-type semiconductor region 118 is advantageous for a shorter traveling path of signal charges.

Therefore, according to the above-described configuration of the present embodiment, the saturation charge amount of the photoelectric conversion unit PD can be increased without causing a decrease in the light-receiving sensitivity of the photoelectric conversion unit PD.

As described above, in the solid state imaging device according to the present embodiment, the gap 140 between the p-type semiconductor region 128a and the p-type semiconductor region 128b is arranged so as to traverse the n-type semiconductor region 118 in the planar view. This is for suppressing characteristic variation due to manufacturing variation.

Each corner of the n-type semiconductor region 118 in the planar view is round as illustrated in FIG. 3, for example, in actual formation, and the degree of the roundness is not necessarily constant depending on the conditions or the like in the formation. Thus, if the gap 140 were arranged so as to overlap with the end of the n-type semiconductor region 118, the shape of the portion where the n-type semiconductor region 118 overlaps with the gap 140 would change depending on the conditions or the like of formation of the n-type semiconductor region 118.

If the shape of a portion where the n-type semiconductor region 118 overlaps with the gap 140 varied depending on variation in formation, the area of the portion where the n-type semiconductor region 118 overlaps with the gap 140 would be required to be set wider in order to obtain a sufficient sensitivity even with such variation. In this case, however, the area of a portion where the n-type semiconductor region 118 overlaps with the p-type semiconductor regions 128a and 128b would decrease, and it would therefore be difficult to sufficiently increase the saturation charge amount of the photoelectric conversion unit PD.

In this regard, in the solid state imaging device according to the present embodiment, the gap 140 between the p-type semiconductor region 128a and the p-type semiconductor region 128b is spaced apart from the corners of the n-type semiconductor region 118 as illustrated in FIG. 3. Therefore, the shape where the n-type semiconductor region 118 overlaps with the gap 140 does not change even with a slight shift of the relative position of the n-type semiconductor region 118 and the p-type semiconductor regions 128a and 128b. That is, in the solid state imaging device according to the present embodiment, since a constant sensitivity can be obtained regardless of variation in formation, a high sensitivity and a large saturation charge amount can be achieved at the same time.

Note that, since there is a concern that overlap of the gap 140 with the gate electrode 124 may cause variation in the transfer performance of signal charges due to a shift of the relative positional relationship, it is desirable to arrange the gap 140 so as to traverse the n-type semiconductor region 118 in the direction in which the gate electrode 124 is not located.

Further, in the present embodiment, the light guide 150 is provided above the semiconductor substrate 110. The light guide 150 is arranged such that a bottom 152 faces the photoelectric conversion unit PD. The light guide 150 is formed by shaping a material having a higher refractive index than a peripheral interlayer insulating film into a truncated conical shape and has a function of guiding an incident light to the photoelectric conversion unit PD. This allows more incident light to be emitted from the bottom 152 to the photoelectric conversion unit PD and improves the sensitivity of the solid state imaging device 100.

As illustrated in FIG. 3, at least a part of the gap 140 overlaps with the bottom 152 of the light guide 150 in the planar view. Thereby, an incident light is guided close to the gap 140 by the light guide 150. Therefore, many charges are generated near the gap 140 and effectively collected into the n-type semiconductor region 118. This improves the sensitivity of the solid state imaging device 100.

Influences caused by the positional relationship of the gap 140 and the bottom 152 of the light guide 150 will be described in detail. FIG. 5A, FIG. 5B, and FIG. 5C are schematic sectional views according to another configuration example of the pixel 12 and illustrate only a part close to the light guide 150 of the schematic sectional view illustrated in FIG. 4. FIG. 5A illustrates a state where the gap 140 overlaps with the bottom 152 of the light guide 150 in the planar view in a similar manner to FIG. 4. FIG. 5B illustrates a state where some part of the gap 140 overlaps with the bottom 152 of the light guide 150 but other part thereof does not overlap with the bottom 152 of the light guide 150 in the planar view. FIG. 5C illustrates a state where the gap 140 does not overlap with the bottom 152 of the light guide 150 in the planar view.

When the sensitivity in the configuration of FIG. 5A is now defined as 1, the sensitivity in the configuration of FIG. 5B is around 0.9, and the sensitivity in the configuration of FIG. 5B is around 0.7. Accordingly, when the gap 140 does not overlap with the bottom 152 in the planar view, the sensitivity significantly decreases compared to the case where the gap 140 overlaps with the bottom 152. Therefore, as described above, it is desirable that at least a part of the gap 140 overlap with the bottom 152 of the light guide 150 in the planar view.

As described above, according to the present embodiment, by providing the light guide 150 above the photoelectric conversion unit PD having the gap 140 in the p-type semiconductor region 128, it is possible to provide a solid state imaging device that can realize a further increase in the sensitivity.

Second Embodiment

Figure 6:
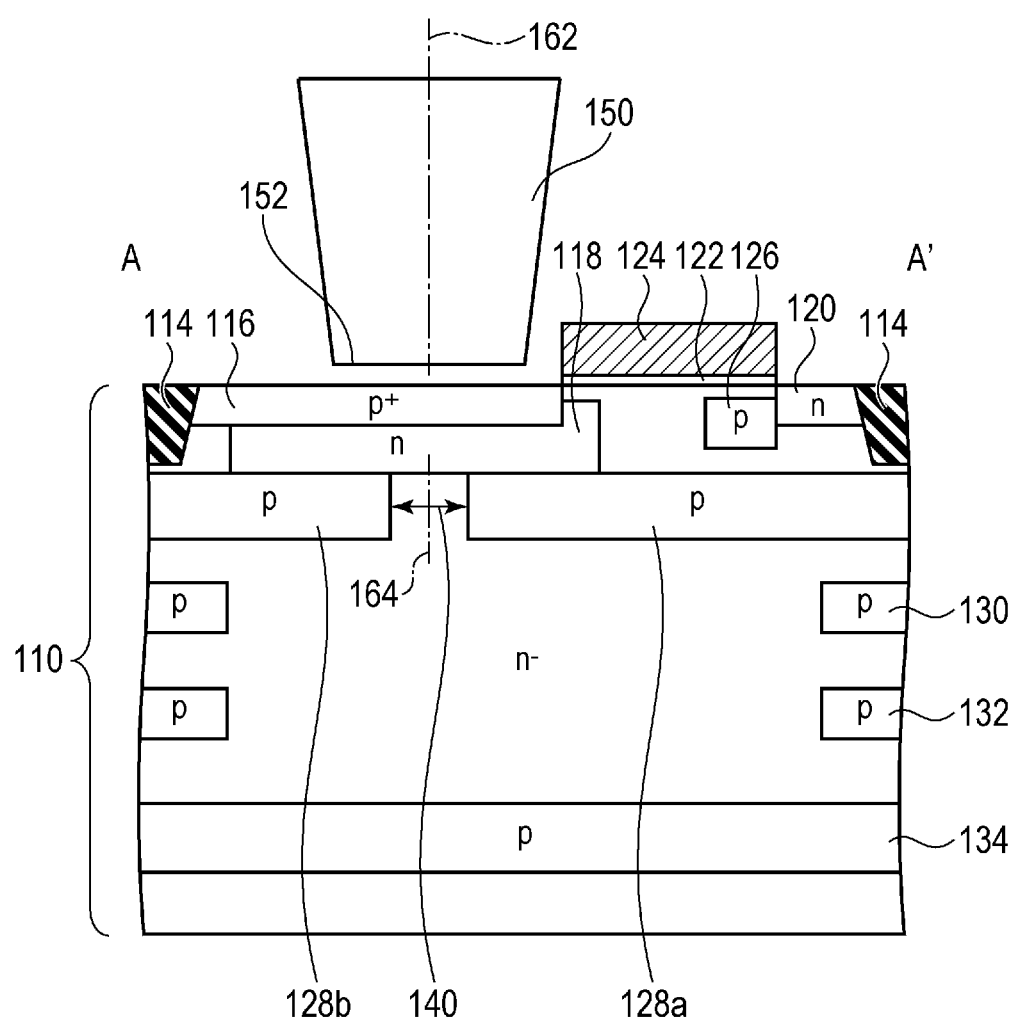
FIG. 6 is a schematic sectional view of a pixel of a solid state imaging device according to a second embodiment of the present invention.

The solid state imaging device 100 according to a second embodiment of the present invention will be described by using FIG. 6. FIG. 6 is a schematic sectional view of the pixel 12 of the solid state imaging device 100 according to the present embodiment. In the present embodiment as illustrated in FIG. 6, the position of the central axis 162 of the light guide 150 and the position of the central axis 164 of the gap 140 are the same in a cross section including a region that the gap 140 and the bottom 152 overlap with each other in the planar view.

The positions of the gap 140 and the light guide 150 may be shifted from each other in the horizontal direction or the depth direction due to processing variation in manufacture of the solid state imaging devices 100. Since the sensitivity varies depending on the positional relationship between the gap 140 and the bottom 152 of the light guide 150 as described above, such a shift may cause variation in the sensitivities of the solid state imaging devices 100. In contrast, since the position of the central axis 162 of the light guide 150 and the position of the central axis 164 of the gap 140 are the same in the present embodiment, a state where the gap 140 overlaps with the bottom 152 of the light guide 150 is likely to be maintained in the planar view.

Therefore, according to the present embodiment, variation in the sensitivities of the solid state imaging devices 100 due to processing variation in manufacturing is reduced in addition to the same effect as obtained in the first embodiment.

Third Embodiment

The solid state imaging device 100 according to a third embodiment of the present invention will be described by using FIG. 7A, FIG. 7B, and FIG. 7C. FIG. 7A is a diagram illustrating the location of the pixels 12b and 12c in the pixel region 10 according to the present embodiment. As illustrated in FIG. 7A, a pixel located near the center of the pixel region 10 is referred to as a pixel 12b, and a pixel located near the end of the pixel region 10 is referred to as a pixel 12c. FIG. 7B is a schematic sectional view of the pixel 12b according to the present embodiment, and FIG. 7C is a schematic sectional view of the pixel 12c according to the present embodiment.

Figure 7C:
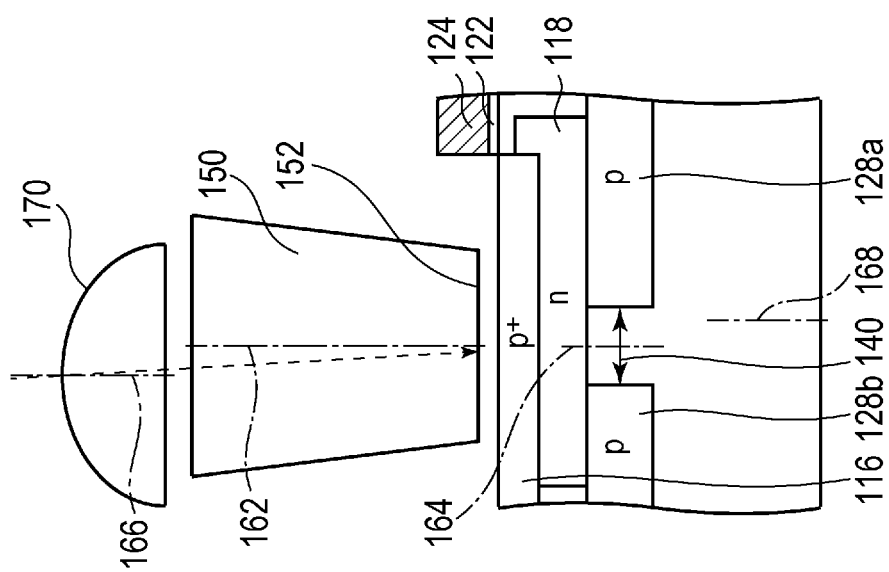
FIG. 7A, FIG. 7B, and FIG. 7C are diagrams illustrating the general structure of a pixel of a solid state imaging device according to a third embodiment of the present invention.
Figure 7B:
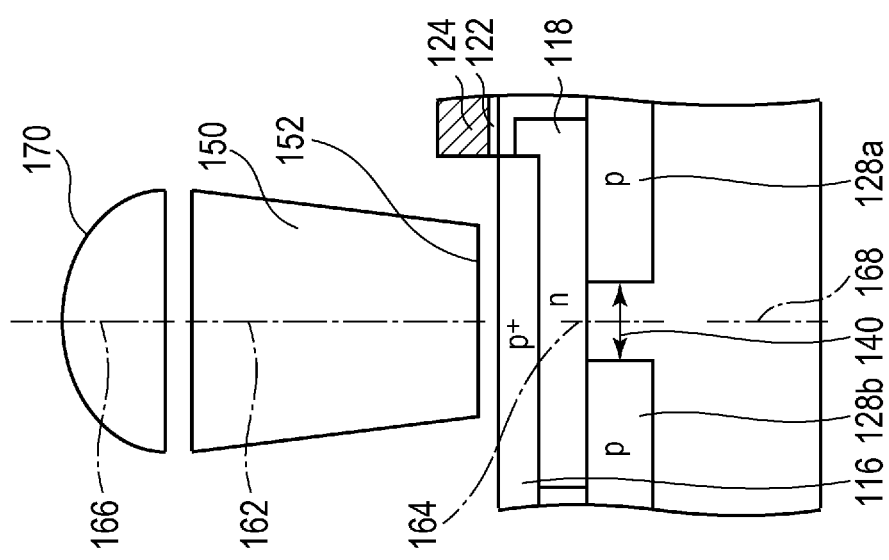
Figure 7A:
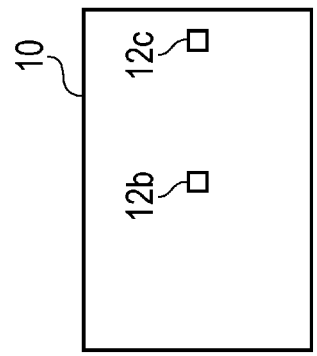

As illustrated in FIG. 7B and FIG. 7C, the pixels 12b and 12c of the present embodiment are provided with a micro-lens 170 above the light guide 150. The micro-lens 170 has a function of improving the sensitivity of the photoelectric conversion unit PD to the incident light by collecting the incident light and emitting it to the light guide 150. In FIG. 7B and FIG. 7C, the center, that is, the optical axis of the micro-lens 170 is depicted as the axis 166 by the dot-dash line.

At the pixel 12b near the center of the pixel region 10 illustrated in FIG. 7B, the positions of the central axis 166 of the micro-lens 170, the central axis 162 of the light guide 150, the central axis 164 of the gap 140, and the central axis 168 of a light receiving surface of the photoelectric conversion unit PD are the same. At the pixel 12b near the center, since a light incidence direction may often be almost vertical, the arrangement as illustrated in FIG. 7B can improve the sensitivity.

On the other hands, in the pixel 12c near the end of the pixel region 10 illustrated in FIG. 7C, the central axis 166 of the micro-lens 170 and the central axis 162 of the light guide 150 are in a shifted positional relationship. At the pixel 12c near the end, a light incidence direction (the dashed line in FIG. 7C) may often be oblique. In the case where the axis 166 and the axis 162 are arranged to be the same as illustrated in FIG. 7B, the sensitivity may decrease due to a shift of the incident position to the photoelectric conversion unit PD for the oblique incident light and due to leakage of the incident light to the outside of the photoelectric conversion unit PD. Therefore, in the present embodiment, for pixels other than pixels located in the center of the pixel region 10, the position of the central axis 166 of the micro-lens 170 and the central axis 162 of the light guide 150 are arranged to be shifted from each other depending on the direction of an incident light to the micro-lens 170 (pupil correction). This allows the light passing through the micro-lens 170 to be efficiently collected in the light guide 150 and enter the photoelectric conversion unit PD.

Note that the position of the central axis 162 of the light guide 150 and the position of the central axis 164 of the gap 140 are the same in FIG. 7C. This is the same configuration as described in the second embodiment, and the same advantage can be obtained. Further, the central axis 162 of the light guide 150 and the central axis 168 of the light receiving surface of the photoelectric conversion unit PD are in the shifted positional relationship in FIG. 7C. This allows for effective photoelectric conversion on the incident light obliquely passing through the light guide 150, which can improve the sensitivity.

As described above, according to the present embodiment, advantages similar to those of the first embodiment can be obtained. In addition, a good sensitivity can be obtained also in the pixel 12c arranged at the end of the pixel region 10. Therefore, the solid state imaging device 100 that can obtain a uniform and good sensitivity over the entire region of the pixel region 10 is provided.

Fourth Embodiment

The solid state imaging device 100 according to a fourth embodiment of the present invention will be described by using FIG. 8A, FIG. 8B, and FIG. 8C. FIG. 8A is a diagram illustrating the location of the pixels 12b and 12c in the pixel region 10 according to the present embodiment. In a similar manner to the third embodiment, a pixel located near the center of the pixel region 10 is referred to as the pixel 12b, and a pixel located near the end of the pixel region 10 is referred to as the pixel 12c. FIG. 8B is a schematic sectional view of the pixel 12b according to the present embodiment, and FIG. 8C is a schematic sectional view of the pixel 12c according to the present embodiment. Since the pixel 12b near the center of the pixel region 10 illustrated in FIG. 8B is the same as that of the third embodiment, the description thereof will be omitted.

In the present embodiment, unlike the third embodiment, at the pixel 12c near the end of the pixel region 10 illustrated in FIG. 8C, the central axis 166 of the micro-lens 170 is not shifted from the central axis 162 of the light guide 150. In this case, the incident position to the photoelectric conversion unit PD for the oblique incident light may be shifted. Therefore, in the present embodiment, the central axis 162 of the light guide 150 and the position of the central axis 164 of the gap 140 are in the shifted positional relationship depending on the direction of an incident light to the micro-lens 170. Thus, also in the configuration of the present embodiment, the light passing through the micro-lens 170 can efficiently enter the photoelectric conversion unit PD.

As described above, according to the present embodiment, advantages similar to those of the first embodiment can be obtained. In addition, the solid state imaging device 100 that can obtain a uniform and good sensitivity over the entire region of the pixel region 10 is provided by the configuration different from that of the third embodiment.

Fifth Embodiment

Figure 9:
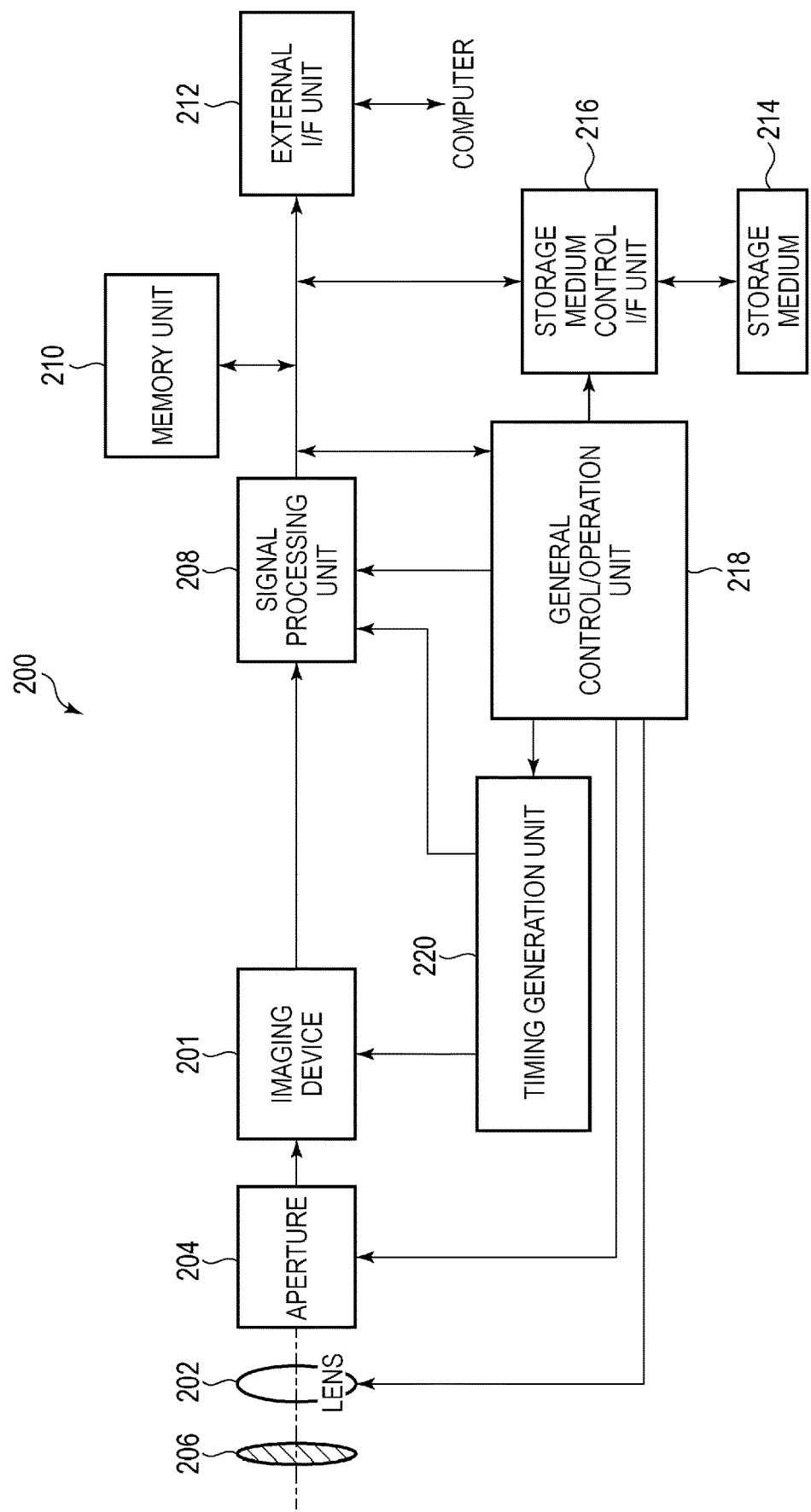
FIG. 9 is a block diagram illustrating a general configuration of an imaging system according to a fifth embodiment of the present invention.

An imaging system according to a fifth embodiment of the present invention will be described by using FIG. 9. Components similar to those of the solid state imaging devices 100 according to the first to fourth embodiments are labeled with the same reference, and the description thereof will be omitted or simplified. FIG. 9 is a block diagram illustrating a general configuration of an imaging system according to the present embodiment.

The solid state imaging device 100 described in the above first to fourth embodiments can be applied to various imaging systems. Examples of the applicable imaging systems may include a digital still camera, a digital camcorder, a surveillance camera, a copier machine, a fax machine, a mobile phone, an on-vehicle camera, an observation satellite, and the like. Further, a camera module having an optical system, such as a lens, and a solid state imaging device may be included in the imaging system. FIG. 9 illustrates a block diagram of a digital still camera as an example of the above.

The imaging system 200 illustrated as an example in FIG. 9 has the imaging device 201, a lens 202 that captures an optical image of a subject onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is any of the solid state imaging devices 100 described in the first to fourth embodiments and converts an optical image captured by the lens 202 into image data.

The imaging system 200 further has a signal processing unit 208 that processes an output signal output from the imaging device 201. The signal processing unit 208 performs AD conversion that converts an analog signal output from the imaging device 201 into a digital signal. Further, the signal processing unit 208 performs other operations of performing various correction or compression if necessary and outputting image data. An AD conversion unit that is a part of the signal processing unit 208 may be formed on the semiconductor substrate in which the imaging device 201 is provided, or may be formed on a different semiconductor substrate from the imaging device 201. Further, the imaging device 201 and the signal processing unit 208 may be formed on the same semiconductor substrate.

The imaging system 200 further has a memory unit 210 for temporarily storing image data therein and an external interface unit (external I/F unit) 212 for communicating with an external computer or the like. The imaging system 200 further has a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further has a general control/operation unit 218 that controls various computation and controls the entire digital still camera and a timing generation unit 220 that outputs various timing signals to the imaging device 201 and the signal processing unit 208. Here, the timing signal or the like may be input from the outside, and the imaging system 200 may have at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

Application of the solid state imaging device 100 of any of the first to fourth embodiments can realize an imaging system 200 that can acquire an image of a good quality.

Sixth Embodiment

Figure 10A:
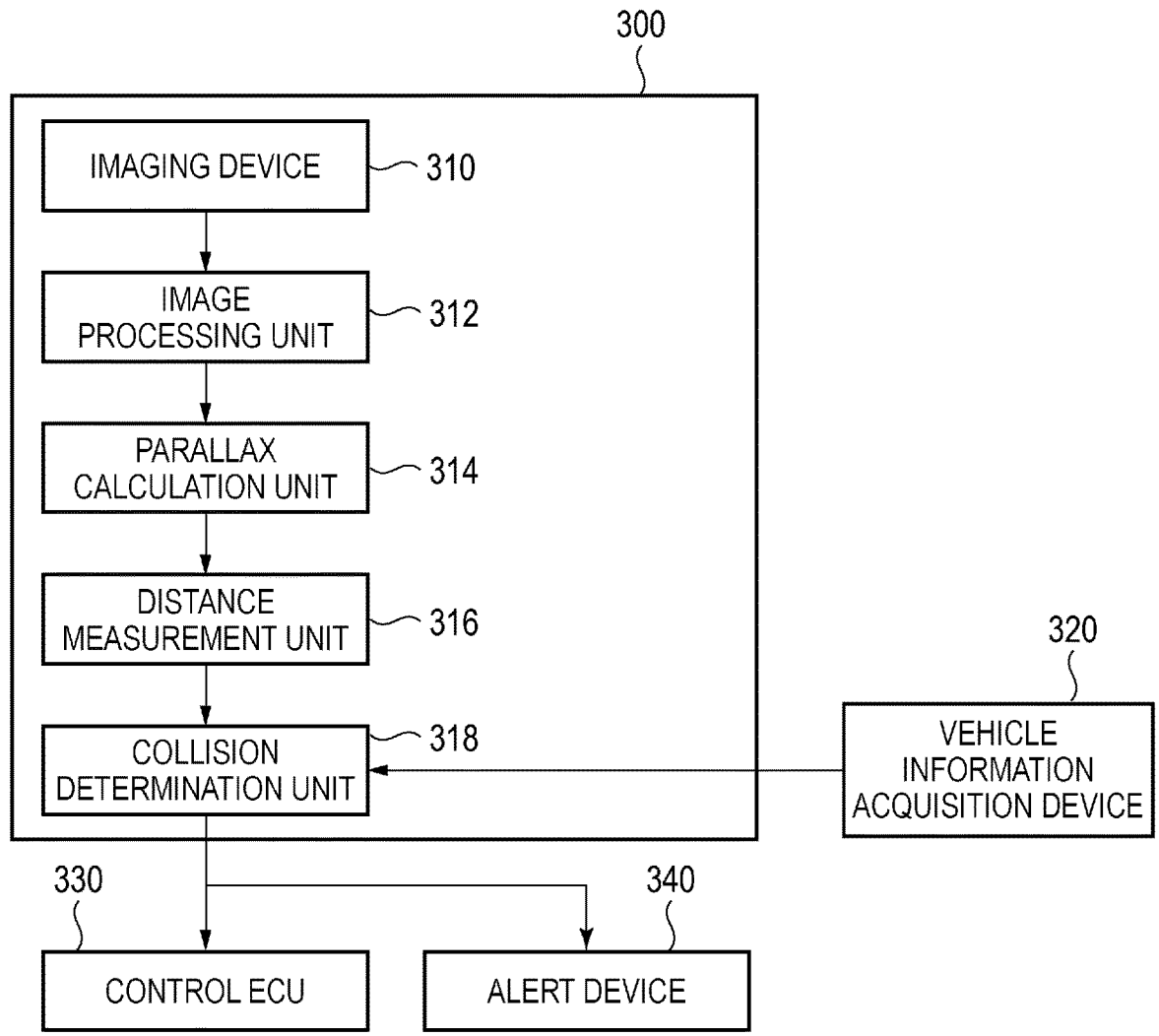
FIG. 10A and FIG. 10B are diagrams illustrating a configuration example of an imaging system and a mobile apparatus according to a sixth embodiment of the present invention.
Figure 10B:
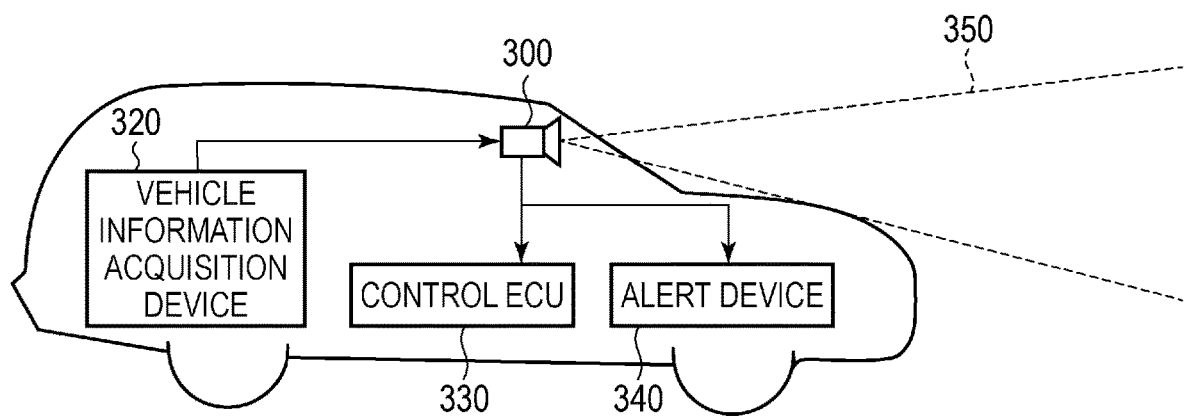

An imaging system and a mobile apparatus according to a sixth embodiment of the present invention will be described by using FIG. 10A and FIG. 10B. FIG. 10A and FIG. 10B are diagrams illustrating a configuration of an imaging system 300 and a mobile apparatus according to the present embodiment.

FIG. 10A illustrates an example of an imaging system 300 related to an on-vehicle camera. The imaging system 300 has an imaging device 310. The imaging device 310 is any of the solid state imaging devices 100 described in the above first to fourth embodiments. The imaging system 300 has an image processing unit 312 that performs image processing on a plurality of image data acquired by the imaging device 310 and a parallax calculation unit 314 that calculates a parallax (a phase difference of parallax images) from the plurality of image data acquired by the imaging system 300. Further, the imaging system 300 has a distance measurement unit 316 that calculates a distance to the object based on the calculated parallax and a collision determination unit 318 that determines whether or not there is a collision possibility based on the calculated distance. Here, the parallax calculation unit 314 and the distance measurement unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected with a control ECU 330, which is a control device that outputs a control signal for causing a vehicle to generate braking force based on a determination result by the collision determination unit 318. Further, the imaging system 300 is connected with an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 10B illustrates the imaging system in a case of capturing a front area of a vehicle (a capturing area 350). The vehicle information acquisition device 320 transmits instructions to the imaging system 300 or the imaging device 310 to perform predetermined operations. Such a configuration can further improve the ranging accuracy.

Although the example of control for avoiding a collision to another vehicle has been described, the embodiment is applicable to automatic driving control for following another vehicle, automatic driving control for not going out of a traffic lane, or the like. Furthermore, the imaging system is not limited to a vehicle such as the subject vehicle, and can be applied to a mobile apparatus (moving apparatus) such as a ship, an airplane, or an industrial robot, for example. In addition, the imaging system can be widely applied to a device which utilizes object recognition, such as an intelligent transportation system (ITS), without being limited to mobile apparatuses.

Modified Embodiments

The present invention is not limited to the above-described embodiments, and various modifications are possible. For example, an example in which a part of the configuration of any of the embodiments is added to another embodiment or an example in which a part of the configuration of any of the embodiments is replaced with a part of the configuration of another embodiment is one of the embodiments of the present invention.

Further, while the example of the solid state imaging device using the photoelectric conversion unit PD that generates electrons as signal charges has been described in the above embodiments, the embodiments can similarly be applied to a solid state imaging device using a photoelectric conversion unit PD that generates holes as signal charges. In this case, the conductivity types of the semiconductor regions forming respective parts of the pixel 12 are opposite to what has been described. Note that the names of the source and the drain of the transistors described in the above embodiments may be different in accordance with the conductivity type of the transistor, the function in interest, or the like, and all or some of the sources and the drains described above may be called by the opposite names.

Further, the circuit configuration of the pixel 12 illustrated in FIG. 2 is an example and can be changed if necessary. The pixel 12 may be any pixel as long as it has at least the photoelectric conversion unit PD and the transfer transistor M1 that transfers charges from the photoelectric conversion unit PD to the charge holding portion. The present invention can be applied not only to a CMOS image sensor but also to a CCD image sensor. Further, the charge holding portion to which charges are transferred from the photoelectric conversion unit PD is not necessarily the floating diffusion FD as an input node of an amplification unit, but may be a charge holding portion separated from the photoelectric conversion unit PD and the floating diffusion FD.

Further, while the p-type semiconductor region 128 is formed of a stripe pattern extending in the row direction in the planar view as illustrated in FIG. 3 in the embodiments described above, the plan layout is not limited to the configuration illustrated in FIG. 3. For example, the p-type semiconductor region 128 may be formed of a stripe pattern extending in the column direction in the planar view. Also in this case, the gap 140 between the p-type semiconductor region 128a and the p-type semiconductor region 128b is arranged so as to traverse the n-type semiconductor region 118 in the planar view.

Further, the imaging systems illustrated in the fifth and sixth embodiments are a configuration example of imaging systems to which the solid state imaging device 100 of the present invention may be applied, the imaging system to which the solid state imaging device of the present invention can be applied is not limited to the configuration illustrated in FIG. 9, FIG. 10A, and FIG. 10B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-110068, filed Jun. 2, 2017, which is hereby incorporated by reference herein in its entirety.

What is claimed is:

1. A solid state imaging device comprising:
a pixel,
wherein the pixel has a photoelectric conversion unit and a light guide, the photoelectric conversion unit being provided in a semiconductor substrate, and the light guide having a top that receives an incident light and a bottom that emits the incident light to the photoelectric conversion unit, an area of the bottom of the light guide being smaller than an area of the top of the light guide,
wherein the photoelectric conversion unit comprises:
a first semiconductor region of a first conductivity type, a bottom of the first semiconductor region being provided at a first depth from a light receiving surface of the semiconductor substrate, and
a second semiconductor region of a second conductivity type and a third semiconductor region of the second conductivity type provided at a second depth deeper than the first depth from the light receiving surface of the semiconductor substrate and spaced apart from each other by a first region,
wherein each of the second semiconductor region, the third semiconductor region, and the first region overlaps with a part of the first semiconductor region in a planar view,
wherein at least a part of the bottom of the light guide and at least a part of the first region overlap with each other in the planar view,
wherein a width of the first region is shorter than a widest portion of the bottom of the light guide, and
wherein a center of the light guide and a center of the first region are the same in a cross section which is perpendicular to the semiconductor substrate and includes a region where the first region and the bottom of the light guide overlap with each other in the planar view.

2. The solid state imaging device according to claim 1, wherein the pixel further has a lens collecting the incident light toward the top of the light guide, and
wherein an optical axis of the lens and the center of the light guide are shifted from each other in accordance with a direction of the incident light to the lens.

3. The solid state imaging device according to claim 2, wherein the first semiconductor region has a first end and a second end opposed to the first end in the planar view, and
wherein the first region is arranged so as to traverse the first semiconductor region across a part of the first end to a part of the second end in the planar view.

4. The solid state imaging device according to claim 1, wherein the first semiconductor region has a first end and a second end opposed to the first end in the planar view, and
wherein the first region is arranged so as to traverse the first semiconductor region across a part of the first end to a part of the second end in the planar view.

5. The solid state imaging device according to claim 1, wherein the first semiconductor region has a first end and a second end opposed to the first end in the planar view, and
wherein the first region is arranged so as to traverse the first semiconductor region across a part of the first end to a part of the second end in the planar view.

6. An imaging system comprising:
the solid state imaging device according to claim 1; and
a signal processing circuit configured to process a signal output from the pixels of the solid state imaging device.

7. A mobile apparatus comprising:
the solid state imaging device according to claim 1;
a distance information acquisition circuit configured to acquire distance information of a distance to an object, from parallax images based on a signal from the solid state imaging device; and
a control circuit configured to control the mobile apparatus based on the distance information.

8. A solid state imaging device comprising:
a pixel,
wherein the pixel has a photoelectric conversion unit and a light guide, the photoelectric conversion unit being provided in a semiconductor substrate, and the light guide having a top that receives an incident light and a bottom that emits the incident light to the photoelectric conversion unit, an area of the bottom of the light guide being smaller than an area of the top of the light guide,
wherein the photoelectric conversion unit comprises:
a first semiconductor region of a first conductivity type, a bottom of the first semiconductor region being provided at a first depth from a light receiving surface of the semiconductor substrate, and
a second semiconductor region of a second conductivity type and a third semiconductor region of the second conductivity type provided at a second depth deeper than the first depth from the light receiving surface of the semiconductor substrate and spaced apart from each other by a first region,
wherein each of the second semiconductor region, the third semiconductor region, and the first region overlaps with a part of the first semiconductor region in a planar view,
wherein at least a part of the bottom of the light guide and at least a part of the first region overlap with each other in the planar view,
wherein a width of the first region is shorter than a widest portion of the bottom of the light guide,
wherein the pixel further has a lens collecting the incident light toward the top of the light guide, and
wherein an optical axis of the lens and a center of the light guide are shifted from each other in accordance with a direction of the incident light to the lens.

9. The solid state imaging device according to claim 8,
wherein the first semiconductor region has a first end and a second end opposed to the first end in the planar view, and
wherein the first region is arranged so as to traverse the first semiconductor region across a part of the first end to a part of the second end in the planar view.

10. A solid state imaging device comprising:
a pixel,
wherein the pixel has a photoelectric conversion unit and a light guide, the photoelectric conversion unit being provided in a semiconductor substrate, and the light guide having a top that receives an incident light and a bottom that emits the incident light to the photoelectric conversion unit, an area of the bottom of the light guide being smaller than an area of the top of the light guide,
wherein the photoelectric conversion unit comprises:
a first semiconductor region of a first conductivity type, a bottom of the first semiconductor region being provided at a first depth from a light receiving surface of the semiconductor substrate, and
a second semiconductor region of a second conductivity type and a third semiconductor region of the second conductivity type provided at a second depth deeper than the first depth from the light receiving surface of the semiconductor substrate and spaced apart from each other by a first region,
wherein each of the second semiconductor region, the third semiconductor region, and the first region overlaps with a part of the first semiconductor region in a planar view,
wherein at least a part of the bottom of the light guide and at least a part of the first region overlap with each other in the planar view,
wherein a width of the first region is shorter than a widest portion of the bottom of the light guide,
wherein the pixel further has a lens collecting the incident light toward the top of the light guide, and
wherein a center of the light guide and a center of the first region are shifted from each other in accordance with a direction of the incident light to the lens in a cross section which is perpendicular to the semiconductor substrate and includes a region where the first region and the bottom of the light guide overlap with each other in the planar view.

11. The solid state imaging device according to claim 10,
wherein the first semiconductor region has a first end and a second end opposed to the first end in the planar view, and
wherein the first region is arranged so as to traverse the first semiconductor region across a part of the first end to a part of the second end in the planar view.

12. The solid state imaging device according to claim 10, wherein the lens is arranged such that an optical axis of the lens and the center of the light guide are the same.

13. The solid state imaging device according to claim 12,
wherein the first semiconductor region has a first end and a second end opposed to the first end in the planar view, and
wherein the first region is arranged so as to traverse the first semiconductor region across a part of the first end to a part of the second end in the planar view.

14. The solid state imaging device according to claim 13, wherein the first region extends to an outside of the bottom of the light guide in the planar view.

15. The solid state imaging device according to claim 14,
wherein the pixel further has a transfer gate configured to control a transfer of charges from the photoelectric conversion unit,
wherein the transfer gate has a long side and a short side in the planar view, and
wherein a direction in which the first region extends is parallel to a direction of the long side of the transfer gate.

16. The solid state imaging device according to claim 14, wherein the part of the first end and the part of the second end are arranged inside the bottom of the light guide in the planar view.

17. The solid state imaging device according to claim 13, wherein the part of the first end and the part of the second end are arranged inside the bottom of the light guide in the planar view.

18. A solid state imaging device comprising:
a pixel,
wherein the pixel has a photoelectric conversion unit and a light guide, the photoelectric conversion unit being provided in a semiconductor substrate, and the light guide having a top that receives an incident light and a bottom that emits the incident light to the photoelectric conversion unit, an area of the bottom of the light guide being smaller than an area of the top of the light guide,
wherein the photoelectric conversion unit comprises:
a first semiconductor region of a first conductivity type, a bottom of the first semiconductor region being provided at a first depth from a light receiving surface of the semiconductor substrate, and
a second semiconductor region of a second conductivity type and a third semiconductor region of the second conductivity type provided at a second depth deeper than the first depth from the light receiving surface of the semiconductor substrate and spaced apart from each other by a first region,
wherein each of the second semiconductor region, the third semiconductor region, and the first region overlaps with a part of the first semiconductor region in a planar view,
wherein at least a part of the bottom of the light guide and at least a part of the first region overlap with each other in the planar view,
wherein a width of the first region is shorter than a widest portion of the bottom of the light guide, and
wherein the first region extends to an outside of the bottom of the light guide in the planar view.

19. The solid state imaging device according to claim 18,
wherein the pixel further has a transfer gate configured to control a transfer of charges from the photoelectric conversion unit,
wherein the transfer gate has a long side and a short side in the planar view, and
wherein a direction in which the first region extends is parallel to a direction of the long side of the transfer gate.

* * * * *